United States Patent [19]

Mennona, Jr.

[11] Patent Number: 5,006,073
[45] Date of Patent: Apr. 9, 1991

[54] SNAP FIT CONTACT ASSEMBLY

[75] Inventor: Vincent J. Mennona, Jr., Boca Raton, Fla.

[73] Assignee: Motorola, Inc., Schaumburg, Ill.

[21] Appl. No.: 524,674

[22] Filed: May 15, 1990

Related U.S. Application Data

[63] Continuation of Ser. No. 357,913, May 30, 1989, abandoned.

[51] Int. Cl.⁵ .............................................. H01R 9/09
[52] U.S. Cl. .......................................... 439/77; 439/80; 439/81; 439/872
[58] Field of Search ........................... 439/77, 80–83, 439/493, 871, 872, 66, 876

[56] References Cited

U.S. PATENT DOCUMENTS

| | | | |
|---|---|---|---|
| 4,353,609 | 10/1982 | Haas | 439/82 |
| 4,526,436 | 7/1985 | Aso | 439/493 |
| 4,682,829 | 7/1987 | Kunkle et al. | 439/83 |
| 4,693,528 | 9/1987 | Asick et al. | 439/83 |
| 4,824,391 | 4/1989 | Ii | 439/77 |
| 4,836,792 | 6/1989 | Glover | 439/81 |
| 4,904,192 | 2/1990 | Holden et al. | 439/80 |

Primary Examiner—Paula A. Bradley
Attorney, Agent, or Firm—Daniel K. Nichols; Pablo Meles

[57] ABSTRACT

A snap fit contact (30) is provided for attachment to a housing (40) wall. The contact (30) includes a contact surface (31) having a peripheral depending wall (32). Snap features (34) are formed in the wall. A flange or lip (35) is carried by the wall for attachment to a flex circuit (41). The contact is received in an opening (44) in the housing. The opening includes a shoulder (47) with the snap feature engaging the shoulder.

20 Claims, 2 Drawing Sheets

SNAP FIT CONTACT ASSEMBLY

This is a continuation of application Ser. No. 07/357,913, filed 05/30/89 and now abandoned.

BACKGROUND OF THE INVENTION

This invention relates to electrical contacts in general and particularly to an electrical contact which can be snap fit into a housing. It is often desirable to have electrical contacts which are mounted into a housing wall. For example, a portable two-way radio typically includes a battery portion which has both charger contacts and contacts for connection to the radio. Various approaches are used for mounting the contacts, such as ultrasonic welding of contact carriers or use of molded in contacts. It is also necessary to connect the contacts to the circuitry on the inside of the housing. One known approach uses the rivets which are affixed to a flex circuit. Rivets, however, do not produce highly reliable electrical connections to flex circuits and require the ultrasonic welding or heat staking of the contact carrier to the housing wall. It is desirable to have a contact that can be surface mounted to a flex circuit and snap fit into a housing opening.

SUMMARY OF THE INVENTION

This contact can be snap fit into a housing opening having a shoulder and furthermore, is surface mountable. The contact includes a contact surface having a wall depending from the periphery of the surface. The wall includes a snap feature. An electrical circuit connection means is carried by the wall. In one aspect of the invention, the electrical circuit connection means is a peripheral lip. In another aspect of the invention, the contact surface wall and peripheral lip constitute an integrally formed metal member. In still another aspect of the invention, the snap feature is a tab formed in the wall. In yet another aspect of the invention, the snap feature constitutes protrusions formed in the wall.

DESCRIPTION OF THE PREFERRED EMBODIMENT

Figure 1:
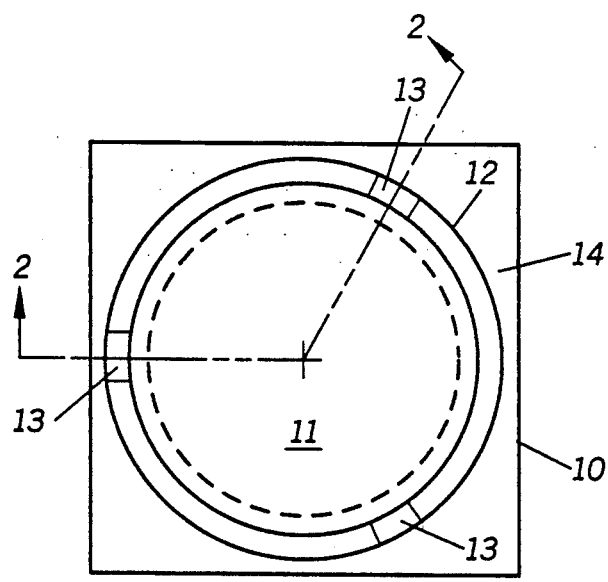
FIG. 1 is a top plan view of a snap fit contact in accordance with the present invention.
Figure 3:
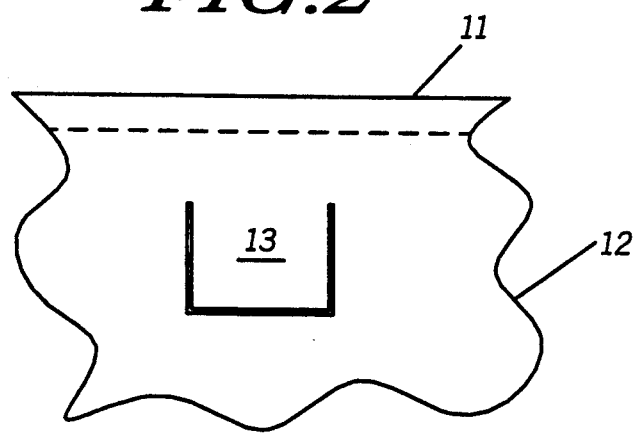
FIG. 3 is a fragmentary elevational view of the contact of FIG. 1.

Referring now by characters of reference of the drawings, and first to FIG. 1, it will be understood that a contact 10 includes an upper contact surface 11 which in this case is formed in a circular shape. A side wall 12 depends from the periphery of contact surface 11. As is more clearly seen in FIG. 3, tabs 13, constituting snap features, are formed in the side wall 12, as by a "U" shaped cut. A peripheral lip, or base 14 extends about the base or flange of the wall 12 and constitutes electrical circuit connection means carried by the wall.

Figure 2:
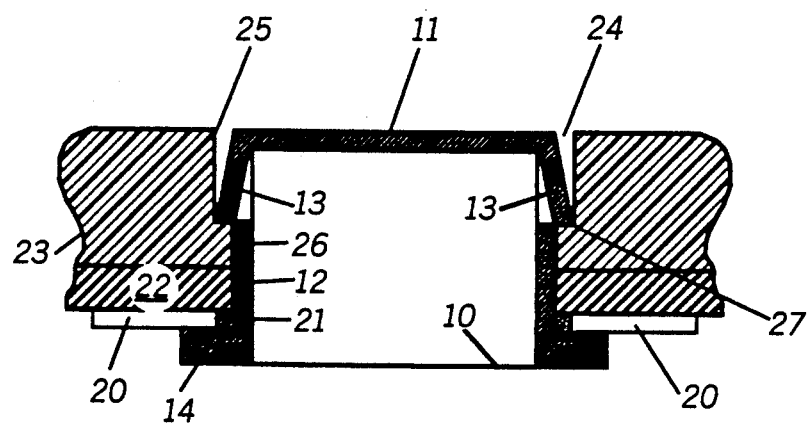
FIG. 2 is a cross-sectional view of the contact of FIG. 1 taken on lines 2—2 shown assembled to a housing.

As is illustrated in FIG. 2, the contact 10 is assembled to a flex circuit 20 that has an opening 21. The contact 10 extends through the opening 21 with the flange 14 engaging and being soldered to the flex circuit 20. If desired, a gasket 22 can be positioned about the contact 10 between the flex circuit 20 and a wall of a housing 23. The housing 23 includes an opening 24 that has a larger outside portion 25 and a narrower inside neck portion 26. A shoulder 27 defines the transition between the opening portions 25 and 26.

After soldering the flange 14 of the contact 10 to the flex circuit 20, and positioning the gasket 22 about the contact, the contact can be pushed through the opening 24 from the inside of a housing 23. The tabs 13 flex or bend to permit the contact 10 to pass through the narrow opening 26 and are received in the wider opening 25. The shoulder 27 between the opening 25 and 26 provides a stop for preventing withdrawal of the contact 10 from the housing opening 24.

Figure 4:
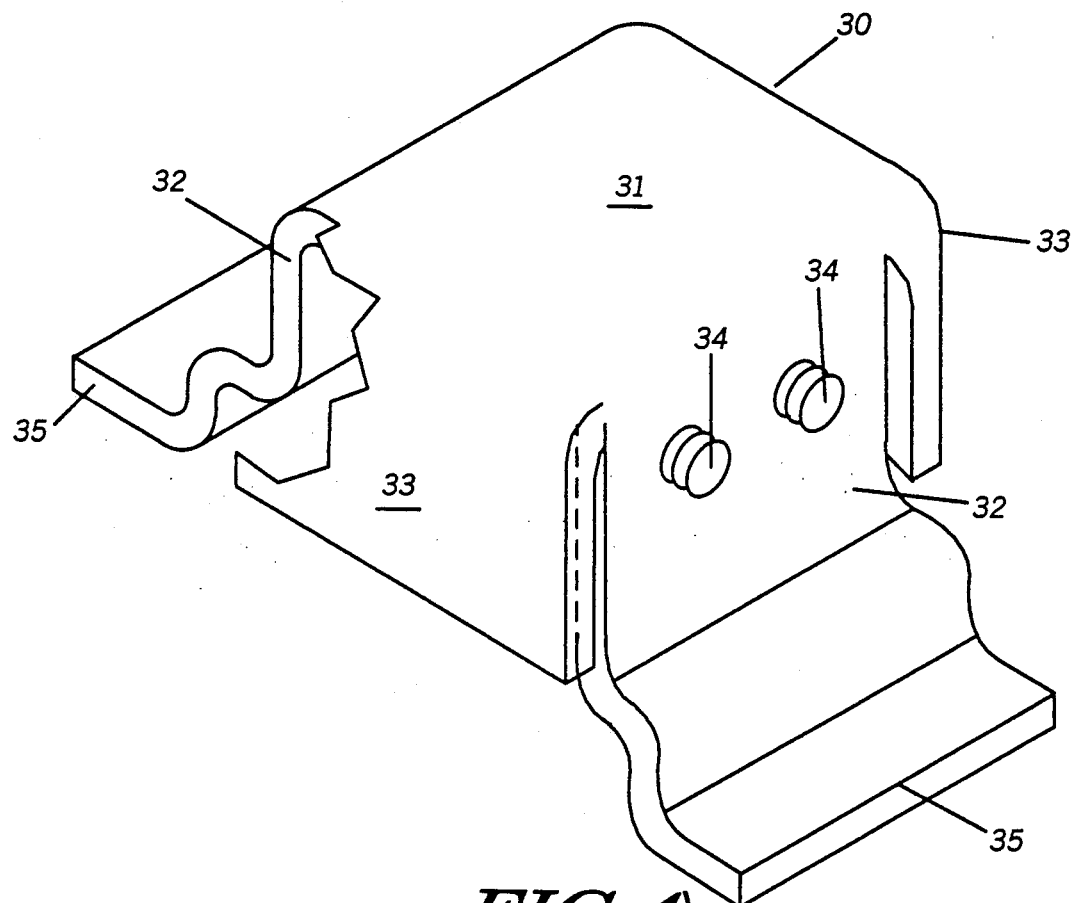
FIG. 4 is an isometric view of another contact in accordance with the present invention.

A modified contact 30 is illustrated in FIG. 4. In this case a rectangular or square contact surface 31, is provided with a first pair of opposed side depending walls 32 and a second pair of opposed side depending walls 33. The walls 32 and 33 depend from the periphery of the contact surface 31. In this case, protrusions 34, constituting snap features, are formed in the walls 32. Lips or flanges 35 are provided at the base of the walls 32 for providing electrical connection of contact 30 as to a flex circuit. As shown in the drawings of FIGS. 1-5, the contact surfaces 11 and 31 are substantially planar.

Figure 5:
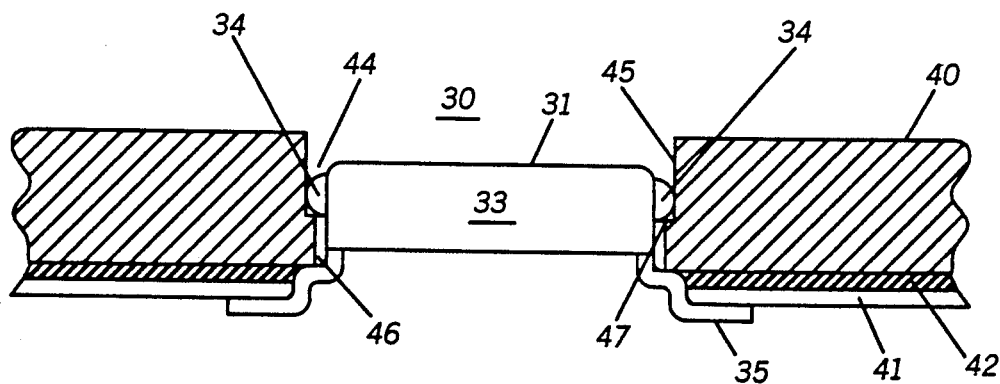
FIG. 5 is a side elevational view of the contact of FIG. 4 shown assembled to a housing.

FIG. 5 illustrates the contact 30 after assembly to a housing 40. A flex circuit 41 receives contact 30 with flanges soldered to the circuit. A gasket 42 is also provided for rain sealing purposes. A housing opening 44 includes a narrower inside portion 46 and wider outside portion 45 with shoulders 47 defining the transition. The walls 32 can flex to permit the protrusions 34 to pass the narrower portion 46 and seat at the shoulders 47.

The contacts 10 and 30 can be stamped and formed from thin metal. Preferably they are plated. Attaching the contacts to a flex circuit first, then snapping the contacts into housing openings provides a low cost, easily manufacturable contact assembly.

I claim as my invention:

1. A snap fit contact for insertion into a housing opening having a shoulder therein comprising:
    a substantially planar top contact surface,
    a wall depending from the periphery of the top contact surface, the wall including a snap feature protruding from the wall, and
    electrical circuit connection means carried by said wall.

2. A snap fit contact as defined in claim 1, in which:
    said snap feature engages a shoulder within an opening in a housing for retaining the electrical circuit connection means.

3. A snap fit contact as defined in claim 1, in which:
    the substantially planar top contact surfaces include battery charger contacts.

4. A snap fit contact as defined in claim 1, in which:
    the substantially planar top contact surfaces include battery contacts.

5. A snap fit contact as defined in claim 1, in which:
    the substantially planar top contact surface is substantially circular shaped.

6. A snap fit contact as defined in claim 1, in which:
    the substantially planar top contact surface is substantially rectangular shaped.

7. A snap fit contact as defined in claim 1, in which:

said electrical circuit connection means comprises at least portions of a peripheral lip.

8. A snap fit contact as defined in claim 7, in which:
the contact surface, wall and portions of the peripheral lip constitute an integrally formed metal member.

9. A snap fit contact as defined in claim 1, in which:
said snap feature comprises tab means formed in said wall.

10. A snap fit contact as defined in claim 9, in which:
said tab means is formed in the upper portion of said wall.

11. A snap fit contact as defined in claim 1, in which:
said snap feature comprises protrusions formed in said wall.

12. A snap fit contact as defined in claim 11, in which:
said protrusions are formed in the upper portion of said wall.

13. A housing and snap fit contact assembly comprising:
a housing having an opening with a shoulder therein;
a contact including, a substantially planar top contact surface, a wall peripherally depending from the top contact surface, the wall including a snap feature, and electrical circuit connection means carried by said wall,
the contact surface being received in said housing opening with said snap feature engaging said shoulder.

14. A housing and snap fit contact assembly as defined in claim 13, further including:
a flex circuit, the contact electrical circuit connection means being electrically affixed to the flex circuit.

15. A snap fit contact as defined in claim 13, in which:
the substantially planar top contact surface is substantially circular shaped.

16. A snap fit contact as defined in claim 13, in which:
the substantially planar top contact surface is substantially rectangular shaped.

17. A snap fit contact as defined in claim 13, in which:
said snap feature comprises tab means formed in said wall.

18. A snap fit contact as defined in claim 17, in which:
said tab means is formed in the upper portion of said wall.

19. A snap fit contact as defined in claim 13, in which:
said snap feature comprises protrusions formed in said wall.

20. A snap fit contact as defined in claim 19, in which:
said protrusions are formed in the upper portion of said wall.

* * * * *